United States Patent
Kang et al.

(10) Patent No.: US 7,514,949 B2
(45) Date of Patent: Apr. 7, 2009

(54) TESTING METHOD DETECTING LOCALIZED FAILURE ON A SEMICONDUCTOR WAFER

(75) Inventors: Joong-Wuk Kang, Chungcheongnam-do (KR); Kwang-Yung Cheong, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 150 days.

(21) Appl. No.: 11/373,339

(22) Filed: Mar. 13, 2006

(65) Prior Publication Data

US 2007/0035322 A1 Feb. 15, 2007

(30) Foreign Application Priority Data

Aug. 10, 2005 (KR) ................. 10-2005-0073497

(51) Int. Cl.
G01R 31/26 (2006.01)
(52) U.S. Cl. .................................... 324/765
(58) Field of Classification Search .................. None
See application file for complete search history.

(56) References Cited

U.S. PATENT DOCUMENTS

| | | | | |
|---|---|---|---|---|
| 5,256,578 A * | 10/1993 | Corley et al. | ............. | 324/158.1 |
| 5,838,951 A * | 11/1998 | Song | ........................... | 324/754 |
| 6,252,412 B1 * | 6/2001 | Talbot et al. | ................ | 324/750 |
| 6,763,130 B1 | 7/2004 | Somekh et al. | | |
| 6,775,819 B1 * | 8/2004 | Hardikar et al. | ............ | 717/105 |
| 6,799,130 B2 * | 9/2004 | Okabe et al. | ................... | 702/82 |
| 6,919,564 B2 * | 7/2005 | Nara et al. | ................... | 250/310 |
| 7,081,769 B2 * | 7/2006 | Lee et al. | ..................... | 324/765 |
| 7,315,366 B2 * | 1/2008 | Hamamatsu et al. | ...... | 356/237.2 |
| 2002/0113967 A1 * | 8/2002 | Nara et al. | ................... | 356/394 |
| 2002/0153916 A1 | 10/2002 | Lee et al. | | |
| 2003/0058444 A1 * | 3/2003 | Nara et al. | ................... | 356/394 |
| 2006/0010416 A1 * | 1/2006 | Keck et al. | ..................... | 716/19 |

FOREIGN PATENT DOCUMENTS

| | | |
|---|---|---|
| JP | 2000243794 | 9/2000 |
| JP | 2001230289 A | 8/2001 |
| KR | 1020050032240 A | 4/2005 |
| TW | 334607 | 6/1998 |
| TW | 582079 B | 4/2004 |
| TW | 591237 B | 6/2004 |
| TW | 239064 B | 9/2005 |

OTHER PUBLICATIONS

Korean Office Action dated Oct. 31, 2008 corresponding to Korean Patent Application No. 10-2005-0073497.
Taiwan Intellectual Property Office Preliminary Notice of First Office Action dated Nov. 25, 2008 with Search Report corresponding to Taiwan Patent Application No. 095118648.

* cited by examiner

*Primary Examiner*—Jermele M Hollington
(74) *Attorney, Agent, or Firm*—Volentine & Whitt, PLLC

(57) ABSTRACT

A method and system for testing a wafer comprising semiconductor chips are disclosed. A determination of whether or not the wafer is defective is made in relation to a spatially related group of filtered failed semiconductor chips on the wafer, where the spatially related group corresponds to a localized failure on the wafer and is used to calculate a defect index value.

26 Claims, 14 Drawing Sheets

TESTING METHOD DETECTING LOCALIZED FAILURE ON A SEMICONDUCTOR WAFER

BACKGROUND OF THE INVENTION

1. Field of the Invention

Embodiments of the invention relate generally to a method and system for testing semiconductor chips on a wafer. More particularly, embodiments of the invention relate to a test method and system identifying a localized failure of semiconductor chips on a wafer.

2. Description of the Related Art

The functional heart of all semiconductor devices is an integrated circuit formed on a die of semiconductor compatible material. This die is commonly referred to as a semiconductor "chip." Semiconductor chips are commercially fabricated in great numbers on material wafers. Wafers are most typically formed from a polished slice of silicon material, but other materials may be used.

The business of fabricating semiconductor chips is a highly competitive one, and fabrication yield (i.e., the percentage of semiconductor chips that actually work out of a total batch of semiconductor chips fabricated on a wafer) is an important business consideration. A couple of yield percentage points up or down is often the difference between profitability and failure. Thus, every aspect of the design, fabrication, and testing of semiconductor chips is ultimately focused on increasing fabrication yield.

Increasing the yield of ever more complicated semiconductor chips is not easy. Contemporary semiconductor chips are fabricated on a wafer using a very complex sequence of different processes. This complex sequence includes a great variety of individual processes ranging across such diverse techniques as photolithography, etching, diffusion, ion implantation, material(s) deposition, etc. Many of these processes form remarkably small elements and regions on the wafer. These elements and regions have extremely narrow fabrication tolerances. Indeed, as integration densities for contemporary semiconductor chips have increased over the past several decades, the respective margins associated with constituent fabrication processes have become increasingly restrictive.

Given the great complexity and the corresponding possibilities for fabrication errors, it is not surprising that semiconductor chips are carefully tested at various stages during their fabrication. Many of these tests are performed on large groups of semiconductor chips as-fabricated on a wafer (i.e., before the individual semiconductor chips are cut from the wafer). This type of testing is generally referred to as "wafer level" testing.

Additional testing takes place once the individual semiconductor chips have been cut from the wafer and packaged to form finished semiconductor devices. Semiconductor device packaging and the corresponding "package level" testing is often conducted by specialized, third-party companies. That is, a semiconductor chip manufacturer may not be involved in the packaging and related package level testing of semiconductor chips. Ideally, every semiconductor chip sent to a packaging vendor by the manufacturer would be a "known good" chip. Accordingly, wafer level testing is an important part of the fabrication sequence ultimately producing a finished semiconductor device.

In addition to understanding which semiconductor chips are "known good", the manufacturer must also understand yield metrics and trends for wafers passing through the fabrication process. It is quite common for first generation semiconductor chips to have no more than a 70 to 80% yield. Through careful testing, analysis, and fabrication process fine-tuning a manufacturer may increase yield to higher than 99%.

One important metric or analytical tool used by manufacturers in the quest for improved yield is the so-called "wafer map". A wafer map identifies good chips (GC) from failed chips (FC) in relation to one or more electrical tests performed on the semiconductor chips. More particularly, a wafer map identifies good chips from bad chips in the context of their fabrication arrangement (i.e., spatial proximity one to another) on a wafer. FIGS. 5, 11 and 12 are exemplary wafer maps discussed later in this disclosure.

Manufacturing efficiencies militate towards a system in which a plurality of wafers (typically 25 wafers) are processed in a batch or "lot." Wafer level testing is conventionally performed on a lot by lot basis to detect and evaluate fabrication process variation(s) resulting in increased or decreased yield. Where an individual wafer within a lot is determined to be defective (e.g., it exhibits an unacceptably low yield), it may be removed from the fabrication process and subjected to a detailed failure analysis. This detailed failure analysis is an expensive and time-consuming process, but it is also a principal step towards improving yield. Accordingly, manufacturers seek to apply their limited quality control resources to the task of failure analysis in the most efficient manner possible in order to obtain the most informative failure analysis.

Thus, the question of defining failure criteria for wafers in a fabrication lot becomes a very important consideration. Further, the ability of manufacturers to coherently capture and appreciate the information resulting from wafer level testing, and wafer failure analysis is critical to their efforts to improve yield. Historically, a threshold or "target yield" has been established for each wafer in a fabrication lot. Those wafers exhibiting an actual yield below the target yield are deemed defective and sent to failure analysis. Those wafers exhibiting yields at or above the target yield are deemed acceptable and are sent out for packaging.

Such a simplistic approach to separating defective and acceptable wafers has proved increasingly unsatisfactory. Further, conventional wafer level testing practices do not provide information on any basis other than a lot by lot basis. Again, this information granularity level is also proving to be increasingly unsatisfactory.

SUMMARY OF THE INVENTION

Embodiments of the invention provide a more intelligent approach to the identification and separation of defective wafers from acceptable wafers within a fabrication lot. The failure analysis thresholding used by embodiments of the invention is no longer limited to only a simple pass/fail target yield. Rather, embodiments of the invention are able identify and account for localized failures on a wafer. Additionally, embodiments of the invention are adapted to provide information to on a wafer by wafer basis, rather than on a lot by lot basis, thereby enabling greater real-time access to defective and/or acceptable wafers within a lot.

Thus in one embodiment, the invention provides a method adapted to testing a wafer comprising semiconductor chips, the method comprising; generating a wafer map indicating failed semiconductor chips, generating a filtered wafer map indicating filtered failed semiconductor chips from the wafer map, calculating a defect index value from the filtered wafer map, and comparing the defect index value to an upper critical limit.

In another embodiment, the invention provides a method adapted to determine whether a wafer is defective, comprising; defining one or more spatially related groups of filtered failed semiconductor chips on the wafer, calculating a defect index value in relation to the one or more spatially related groups of filtered failed semiconductor chips, and comparing the defect index value to a critical upper limit.

In yet another embodiment, the invention provides a test system comprising; a wafer tester adapted to perform an electrical test on semiconductor chips formed on a wafer and generate corresponding test data, a controller adapted to store the test data as a data file in a database, wherein the controller operatively executes in conjunction with the database one or more software modules. The software modules are adapted to generate a wafer map indicating failed semiconductor chips, generate a filtered wafer map indicating filtered failed semiconductor chips, define one or more spatially related groups of the filtered failed semiconductor chips, calculate a defect index value in relation to the one or more spatially related groups of filtered failed semiconductor chips, and compare the defect index value to a critical upper limit.

In yet another embodiment, the invention provides a test method adapted to determine whether a wafer comprising semiconductor chips is defective, comprising; defining a spatially related group of filtered failed semiconductor chips on the wafer wherein the spatially related group of filtered failed semiconductor chips corresponds to a localized failure on the wafer, and calculating a defect index value in relation to the spatially related group of filtered failed semiconductor chips, and upon determining that the defect index value exceeds a critical upper limit, determining that the wafer is defective.

BRIEF DESCRIPTION OF THE DRAWINGS

Exemplary embodiments of the invention will be described hereafter with reference to the attached drawings in which like reference numerals refer to like or similar elements. The drawings.

FIGS. (FIGS.) 1A and 1B are related flowchart sections illustrating one exemplary test method according to an embodiment of the invention.

DESCRIPTION OF THE EXEMPLARY EMBODIMENTS

Selected features and advantages associated with several embodiments of the invention are described hereafter with reference to the accompanying drawings. The invention may, however, be implemented in various embodiments. The nature, construction, and compostion of elements and/or steps in the following embodiments may be modified without removing such modifications from the actual scope of the invention as defined by the attached claims.

Figure 1A:
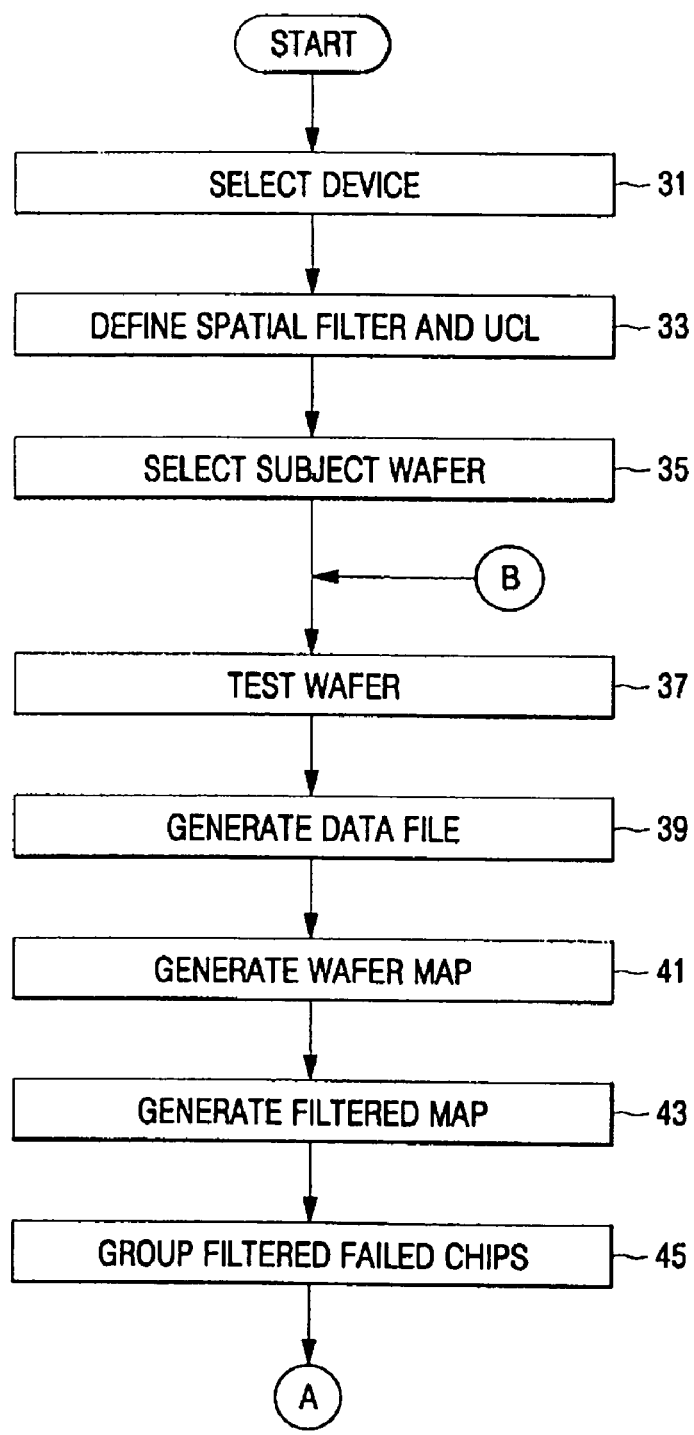
Figure 1B:
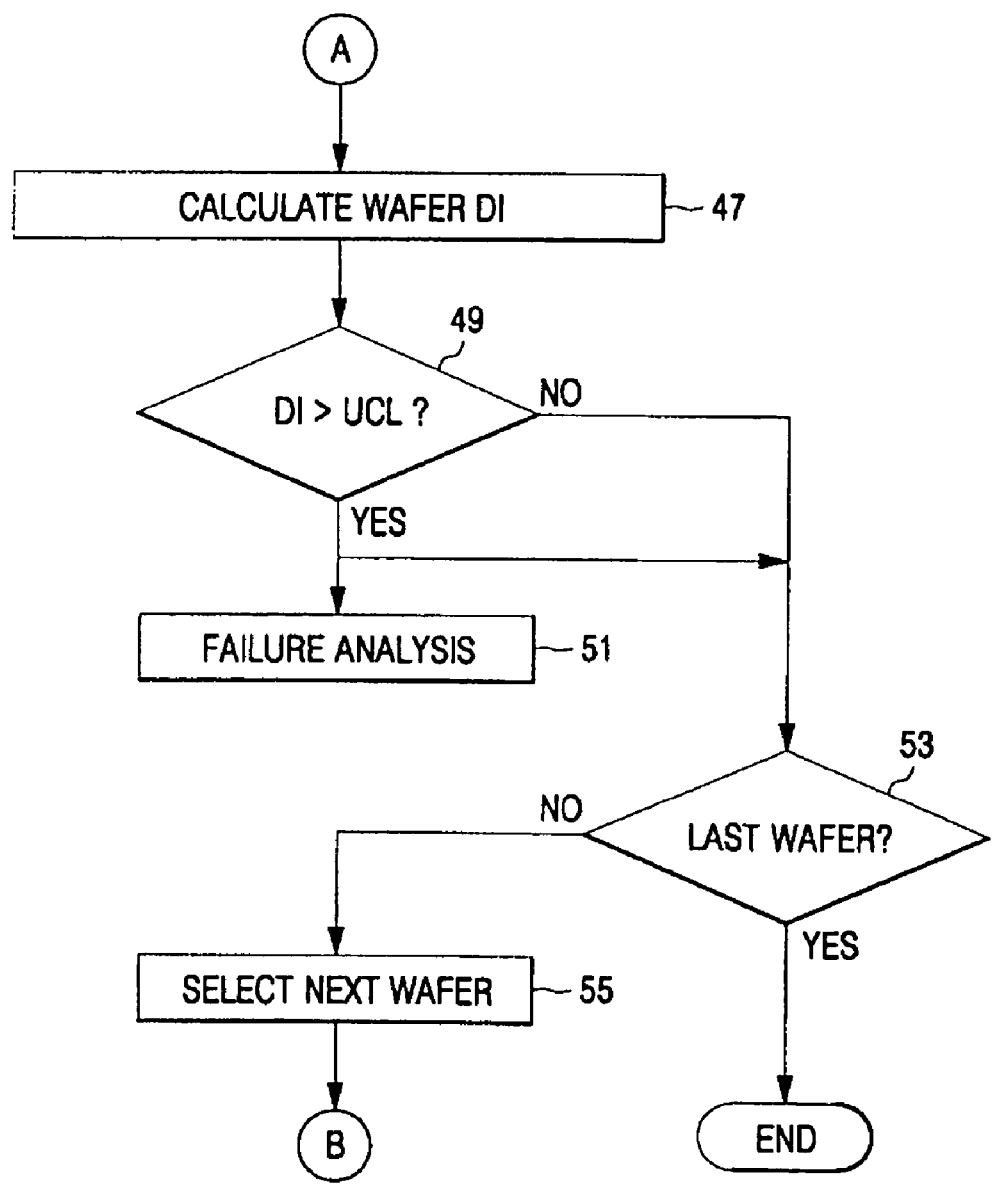

In particular, an exemplary test method according to one embodiment of the invention is described hereafter in relation to the flowchart shown in FIGS. 1A and 1B. In the description of this embodiment, certain functions and method interrelationships are referred to as "steps". This step by step approach to explaining the use of an exemplary test method should not be given an overly-literal interpretation. The steps are merely explanatory references. In actual implementation, the exemplary steps might be combined or further partitioned, re-arranged into many different orders, and/or combined with conventional processes.

As noted above in the Background section, embodiments of the invention have been developed against a backdrop of conventional wafer level testing conducted on a lot by lot basis. That is, conventionally, the semiconductor chips on each wafer within a wafer lot are subjected to battery of (e.g., one or more) electrical tests on a wafer by wafer basis. Only after all of the wafers in the lot have been tested will "lot data" be made available to a test system operator or an external data recipient (human or machine). In many cases, the lot data is merely an indication of wafers found to be defective and perhaps a list identifying the defective wafers by an identifying number. This type of defective verses acceptable wafer determination is conventionally made in relation to only a simple target yield threshold. Information provided at this level is of marginal value, particularly when it is provided on only a lot data basis. In response to this type of information, a fabrication technician can often do little more than pull the defective wafer from its fabrication lot and send it quality control for failure analysis.

This conventional approach to wafer testing completely ignores an important criterion upon which a more rational determination of a defective wafer should be made. This criterion distinguishes failed chips on the wafer as being distributed in nature or localized in nature. The identification of a "localized failure" (e.g., a spatially correlated group of failed semiconductor chips) on a wafer is very important to a manufacturer's efforts to improve yield. Unlike "distributed failures" (e.g., failed chips on a wafer having little or no spatial correlation) which often have vague, complex or disparate failure modes, localized failures often provide clear evidence or positive indication of a particular failure mode. The cause of a localized failure may include particle contamination, a wafer scratch, a mask pattern failure, etc. Many of these failures modes, once identified, may be remedied by actions along the fabrication line (e.g., near term inspection or adjustment of the fabrication equipment).

A first embodiment of the invention will now be described in relation to the flowchart shown in FIGS. 1A and 1B. This flowchart illustrates an exemplary method adapted to the testing of a wafer lot that avoids the drawbacks associated with conventional testing methods. In particular, this exemplary method identifies localized failures on individual wafers and also provides greater real-time access to test data on a wafer by wafer basis. Throughout this description, exemplary method steps are indicated using parentheses (XX).

Referring to FIG. 1A, the illustrated method begins by selecting a device type to be tested (31). A device type may correspond to one or more specific semiconductor chip designs. Many different types and/or versions of semiconductor chips may be fabricated using generically applied fabrication equipment. The step of selecting a device type (31) may cause automated test equipment to retrieve from memory a battery of tests associated with the selected device type. The automated test controller may thereafter power up and/or configure test equipment according to the indicated battery of tests. Alternatively, the step of selecting a device type (31) may produce a defined sequence of instruction prompts for a test technician responsible for testing the subject wafer on a wafer tester. The term "subject wafer" is used in this description to identify a wafer being tested or a wafer from which test data was derived, and merely distinguishes, potentially, other wafers in a lot.

Figure 2:
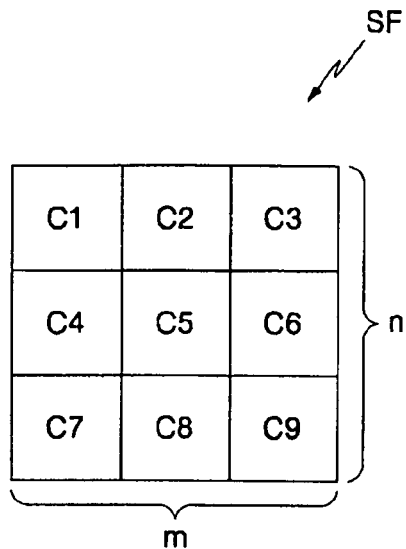
FIG. 2 illustrates an exemplary spatial filter formed by a two-dimensional n by m matrix.

After selecting a device type to be testing, a "spatial filter" is defined (33). The spatial filter may be a geometric pattern or a mathematical relationship correlating semiconductor chips according to their relative position on the subject wafer. The spatial filter may take many different forms, but in the illustrated example of FIG. 2 a spatial filter formed by a two-dimensional (e.g., row & column) matrix is used. The choice of a two dimensional matrix is convenient one, since individual semiconductor chips are often fabricated in respective areas on a wafer defined by rows and columns on a layout matrix.

Where a two dimensional matrix serves as a spatial filter, it may be expressed as comprising "n" rows and "m" columns. Thus, the "size" of the spatial filter may be expressed by multiplying its constituent rows and columns. For example, the exemplary spatial filter (SF) illustrated in FIG. 2 comprises 3 rows and 3 columns, and has a corresponding size of 9. Further each "cell" within the matrix (i.e., each unique row and column cross-section, or C1 through C9 in FIG. 2) may be assigned a weighting coefficient. Collectively, the spatially related weighting coefficients define the "weight" of the spatial filter.

Thus, in one embodiment, the step of defining a spatial filter (33) comprises defining its size and weight. As will be described in some additional detail hereafter, a spatial filter properly defined by weight and size may serve as a weighting filter (e.g., a low-pass spatial filter in one embodiment). However defined, the weight and size of the spatial filter will vary in accordance with the type of device being tested and the failure modes being identified in relation to the wafer. In particular, the size (minimum and/or maximum) of localized failures to be identified by the exemplary method will be determined by the definition of the spatial filter.

Taking device type and the failure modes to-be-identified into account, a spatial filter of proper size and weight may be defined in relation to empirical data derived from past testing runs on similar semiconductor chips. The selection of the size of a spatial filter and the weighting coefficients for each constituent cell within the spatial filter will define the sensitivity or focus of the test method in relation to potential localized failures.

Once the spatial filter has been defined, the exemplary method selects an upper critical limit (UCL) for a target defect index value (DI). The defect index value is a value subsequently calculated (see, step 47) from test data derived from the electrical/functional testing of a wafer. The upper critical limit (UCL) is a sensitivity setting for the defective/acceptable determination to be made in relation to a subject wafer. A calculated defect index value (DI) for a subject wafer above the established upper critical limit (UCL) may result in the subject wafer being sent to failure analysis. It is common for the upper critical limit (UCL) for wafers to rise with successive generations of the semiconductor devices being formed on the wafer. That is, expected higher yields will result in a rising upper critical limit (UCL).

With the spatial filter and upper critical limit defined, a subject wafer is selected for testing (35). This selection may be made robotically from a wafer lot using a bin number or an identifying label associated with the subject wafer. Following its selection, the subject wafer is tested (37).

The subject wafer may be tested using one or more electrical and/or functional tests. For example, DC tests, such as open/short testing may be performed. Additionally or alternatively, AC tests, such as specific functionality, march testing, and/or checker board testing, may be performed. It is possible for an individual semiconductor chip to pass one test, yet fail another test during a battery of electrical tests. The results for each electrical test conducted on a wafer may be stored in memory (e.g., a database) in relation to each semiconductor chip on the wafer. This is important since very often multiple wafers in a lot are tested on one wafer tester before being moved to another test station and being tested with a different wafer tester. Test data must therefore be retrievable by wafer ID number, bin number, etc. for each wafer in a lot, and for each test within a battery of tests performed on a subject wafer.

Thus, test data may be recorded in one or more data files associated with the subject wafer (39). The term "data file" is used to generically indicate any reasonable number of individually accessible data file(s), and/or data structure(s) susceptible to efficient definition, archiving, analysis (manual or machine), and retrieval. Test data may be used in relation to test criteria to define good chips and failed chips on a test by test basis, or on a cumulative testing basis. Once test data has been effectively captured in a data file, a wafer map may be generated (41).

The term "wafer map" means not only a graphical representation of some spatially related quality between semiconductor chips on a subject wafer, but also the data associated with the representation. Thus, a wafer map may be a graphical data file susceptible to visual communicated to a human test system operator or quality control manager. Alternatively, a wafer map may simply comprise a data set stored in a data file that establishes some spatially quality between semiconductor chips on the subject wafer. This data file may only be accessed by computational logic, rather than a human operator. In this context, the phrase "generating a wafer map" should be broadly construed as any step wherein an order data set is defined that expresses some spatially related quality between semiconductor chips on a wafer. This quality need not be visually communicated to a human operator in order to have the data set fall within the scope of the term "wafer map." Similarly, the phrase "applying a spatial filter to the wafer map" connotes at least a process where the weighting coefficients contained in a spatial filter are mathematically applied to data underlying a wafer map, because the weighting coefficients could not reasonably be said to be applied to a wafer map where this term is limited to only graphical representations.

Figure 3:
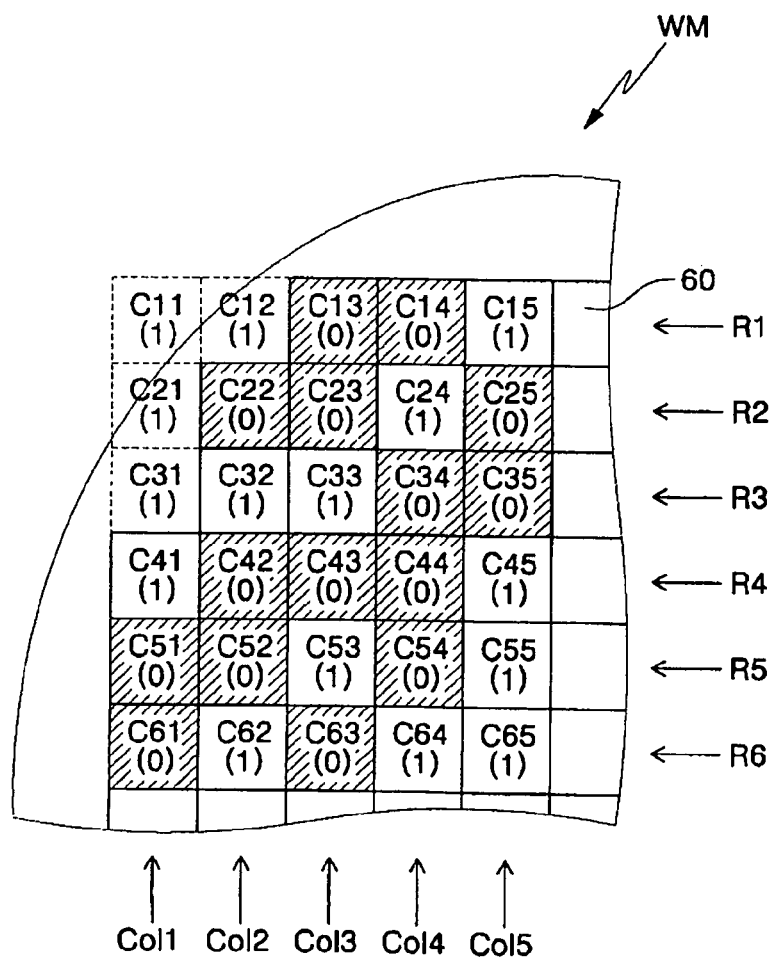
FIG. 3 illustrates a potion of an exemplary wafer map (WM) identifying good chips from failed chips within an overlaying layout matrix.

A portion of an exemplary wafer map (WM) is illustrated in FIG. 3. The wafer map is expressed in terms of a rectangular, two-dimensional layout matrix 60 comprising in the illustrated portion rows R1 through R6, and columns Col 1 through Col 5. Individual semiconductor chips are formed in the respective cells (C11 through C65) defined by layout matrix 60. Layout matrix 60 also defines certain "virtual chips" on the subject wafer, (e.g., partial, non-operative chip portions formed in wafer edge portions occupying cells C11, C12, C21, C31, for example). Virtual chip designations are necessary because wafers are circular in shape while the corresponding layout matrixes are rectangular. Referring to FIG. 3, good chips are indicated by a test data value of "1" and failed chips (shaded) are indicated by a test data value of "0" within layout matrix 60. The failed chips are also shaded for ease of identification in the illustration.

As suggested above, a wafer map may be generated (41) on a macro-testing basis or specific-testing basis. Expressed on a macro-testing basis, as is common, a good chip indication means that a chip has passed all of the tests in an applied battery of electrical tests. A failed chip indication means that a chip has failed one or more of the tests. However, good chip and bad chip indications may be made on a wafer map in relation to only a single test or any plurality of related tests, less than the whole of the battery of tests.

Figure 4:
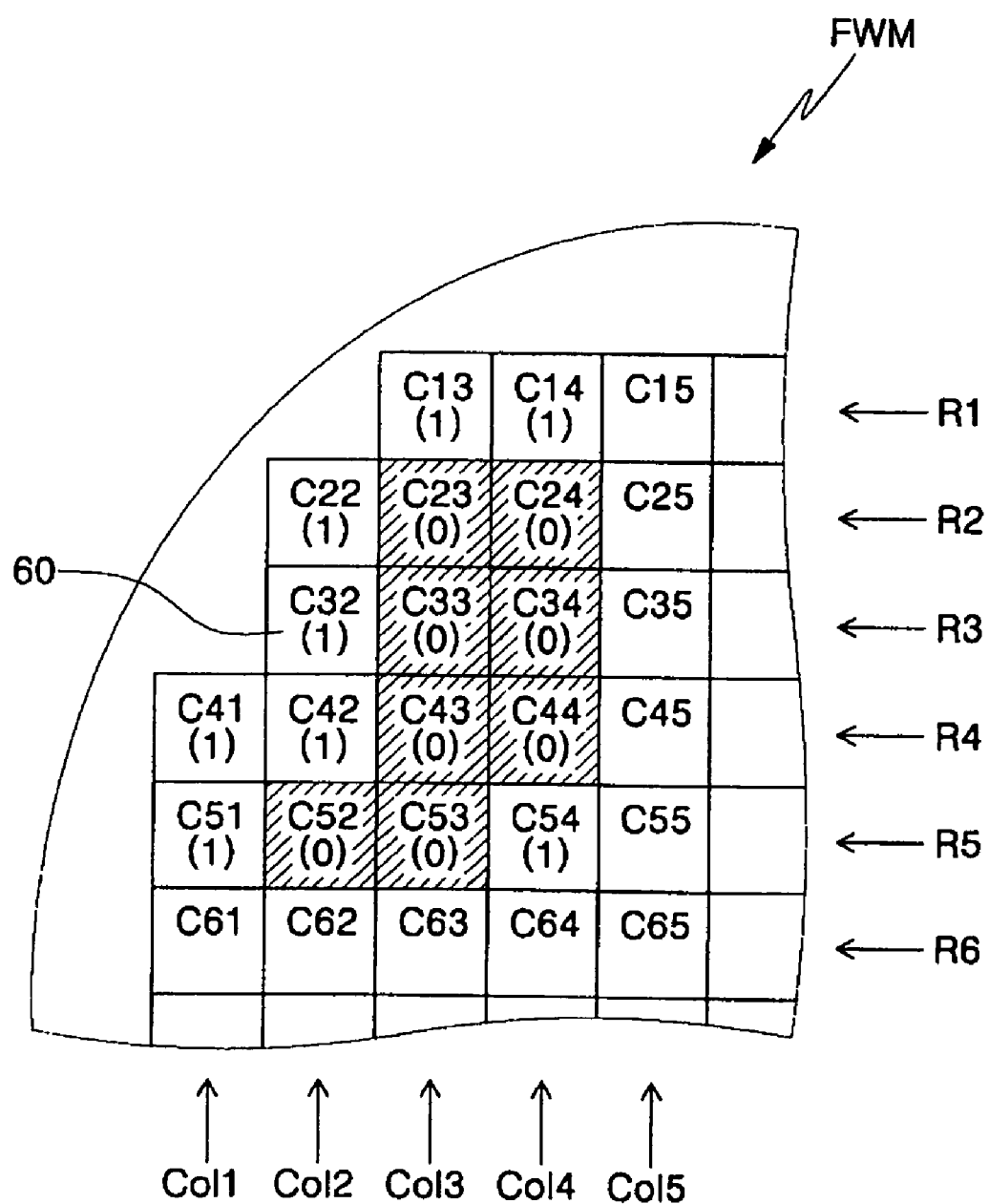
FIG. 4 illustrates a portion of an exemplary filtered wafer map (FWM), as derived from the wafer map (WM) of FIG. 3.

Having generated a wafer map according to one or more of the foregoing or similar criteria, a filtered wafer map (FWM) is generated (43). FIG. 4 illustrates an exemplary filtered wafer map derived, for example, from wafer map shown in FIG. 3.

The filtered wafer map is derived by applying a defined spatial filter to a wafer map. In one embodiment, the application of a spatial filter to a wafer map is accomplished by multiplying one-for-one the weighting coefficients in a spatial filter matrix by the test data values associated with semiconductor chips identified in a corresponding layout matrix to produce weighted product values. That is, in one embodiment of the invention, semiconductor chips are arranged on a wafer according to layout matrix 60. Layout matrix 60 may have any reasonable definition (e.g., geometric shape or mathematical relationship) accurately corresponding to the spatial relationship of semiconductor chips on a wafer. The applied spatial filter, having a predetermined size and weight, may be defined in view of layout matrix 60, such that it may be easily applied on a one chip for one chip basis across layout matrix 60.

In one example, a 3 by 3 spatial filter having 9 cells, each having an assigned unity weighting coefficient (1.0) is assumed. Then, beginning with a first cell (e.g., cell C11) in layout matrix 60, the spatial filter is sequentially applied to (e.g., centered over) each cell in the layout matrix. During each application of the spatial filter, a number of cells adjacent to the subject cell (or a number of proximate cells where the size of the spatial filter is different) will be overlain by the spatial filter. These captured cells contribute their respective test data values to an equation adapted to determine a "filtered value (P)" for the subject cell. Recall that the test data value for each captured cell corresponds to its testing outcome. In the illustrated example, simple indications of "1" and "0" are used as exemplary test data values indicating good and failed semiconductor chips.

Where cell C43 in the layout matrix of FIG. 3 has the exemplary spatial matrix applied to it, cells C32, C33, C34, C42, C43, C44, C52, C53, and C54 are captured. The test data values associated with the semiconductor chip identified on the wafer by the layout matrix are then respectively multiplied by a weighting coefficient from the spatial filter to produce corresponding weighted product values, as part of the calculation of the filtered value (P) for cell 43.

Various equations lend themselves to the calculation of a filtered value (P) for each of the subject cells in a layout matrix. Those of ordinary skill in the art will recognize that several known equations may be modified, taking into consideration the spatial filter being used, to properly define a desired filtering effect for the test data values associated with the semiconductor chips. In one embodiment, the following equation may be used to calculate the filtered values (P):

$$P = \frac{\sum_{j=1}^{n \times m} Sj \times Wj}{m \times n},$$

where "j" is the location of for each cell in the layout matrix captured by the spatial filter matrix, "S" is the test data value (e.g., "1" or "0" in the illustrated example) associated with the semiconductor chip corresponding to the captured cell in the layout matrix, and "W" is the weighting coefficient assigned to the corresponding cell in the spatial matrix.

Continuing with the foregoing example of the exemplary 3 by 3 spatial filter being applied to cell C43 in the layout matrix shown in FIG. 3, and assuming each weighting coefficient "W" in the spatial filter has a unity value of 1.0, a filtered value of P=0.33 is calculated for cell C43. If we further assume a reference filtered value ($P_{ref}$) (e.g., a filtered good/failed threshold), of 0.5, then cell C43 is determined to be a "filtered failed chip" within the filtered wafer map shown in FIG. 4. This is an example of a calculation adapted to define good or failed values for all the non-virtual semiconductor chips associated with the partial layout matrix shown in FIG. 4.

The foregoing selection of 0.5 as the reference filtered value ($P_{ref}$) is logical in the context of the working example since only two outcome states may be indicated by the single bit binary test data values assumed. However, other reference filtered values ($P_{ref}$) are certainly possible in view of alternate test data definitions and/or desired filtering effects.

In the foregoing example, where the spatial filter is applied to cell C22 it will overlay a number of virtual chips (e.g., C11, C12, C21, and C31). In a related aspect, these virtual chips may be assumed to have data values corresponding to "good chips" for purposes of calculating a filtered value for cell C22.

Figure 5A:
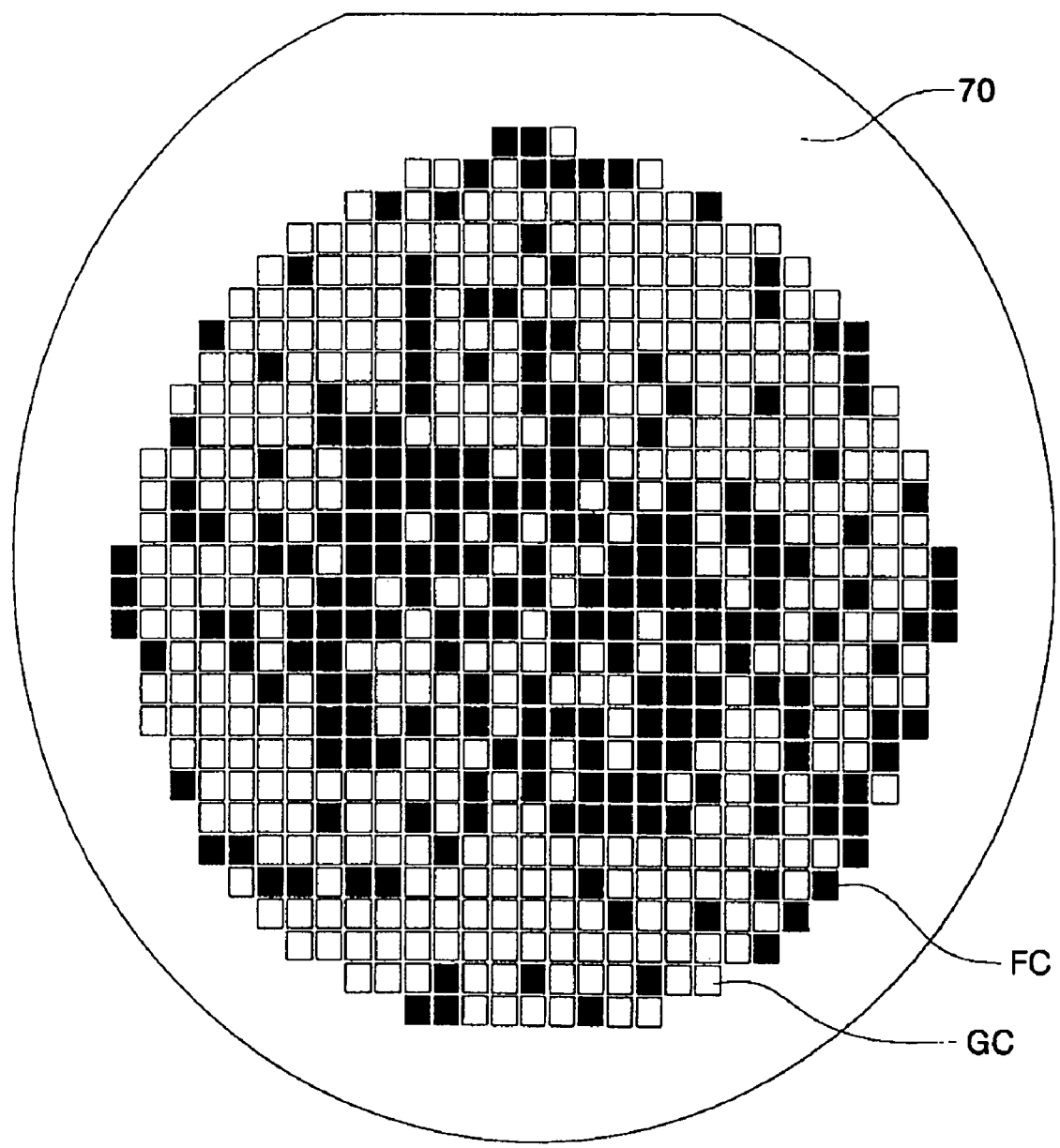
FIG. 5A is an exemplary wafer map and FIG. 5B is a related filtered wafer map, derived from the wafer map of FIG. 5A.
Figure 5B:
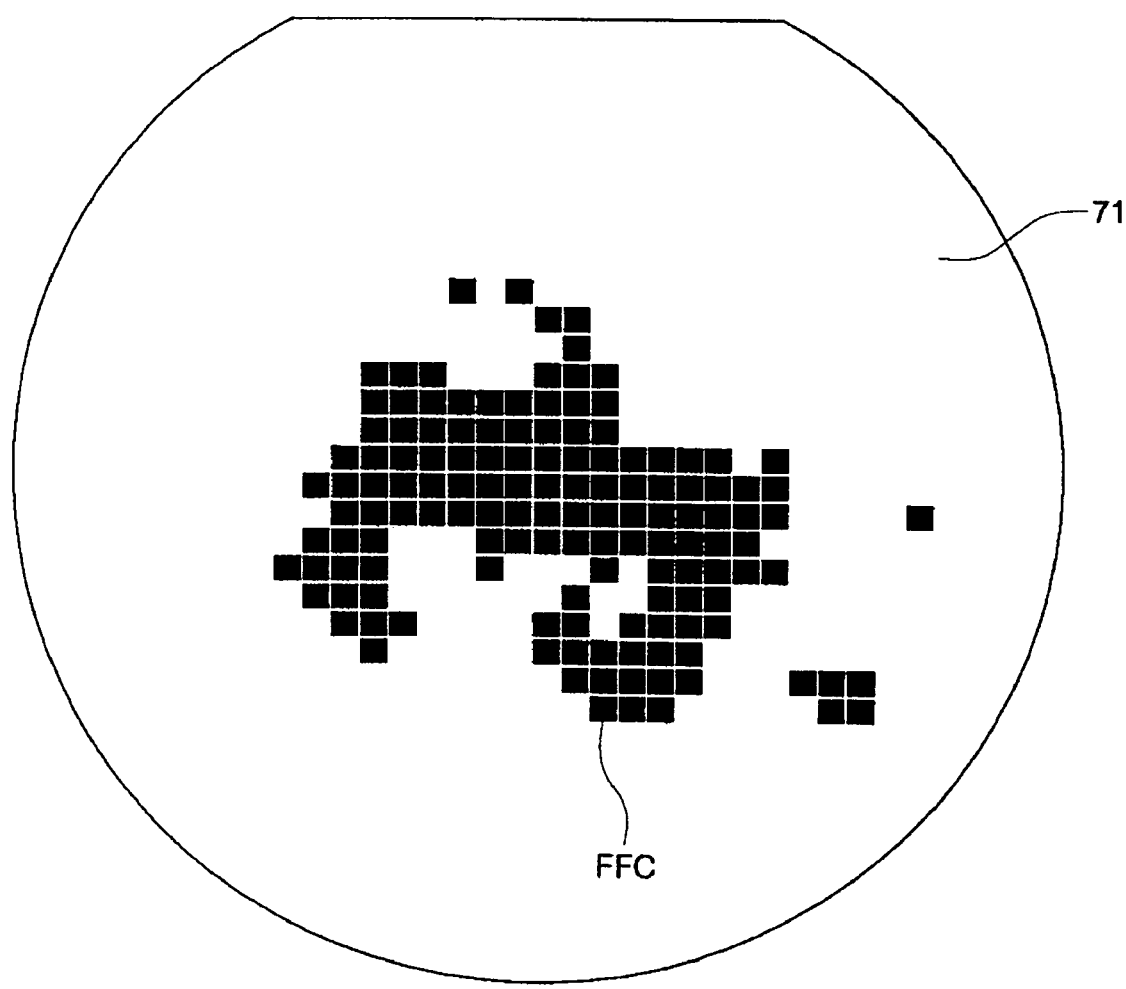

FIGS. 5A and 5B comparatively illustrate the generation of a filtered wafer map 71 from a wafer map 70 using a test method similar to the example described above. By passing the apparently well distributed plurality of failed chips (FC) identified in wafer map 70 through a properly weighted spatial filter, a very different filtered wafer map 71 emerges in which several clusters of filtered failed chips (FFC) may be identified on the subject wafer. These clusters of filtered failed chips may indicate one or more localized failures related to the processing of the subject wafer. The weighting effect of the spatial filter as applied to the failed chips (FC) of wafer map 70 is very analogous to classic low-pass filtering effects in that singularities and outliers within the collection of failed chips may be dismissed as being statistically insignificant in their spatial significance.

Referring again to the flowchart of FIG. 1A, after a filtered map has been generated in step (43), grouping of the filtered failed chips in the filtered map is performed (45). The term "grouping" in this context, like the term "applying" previously discussed, may be a visual mapping related operation and/or a data processing related operation conducted with or without test system operator intervention. Grouping in the present example results in group values defined by size. However, other grouping techniques may be used.

Figure 6:
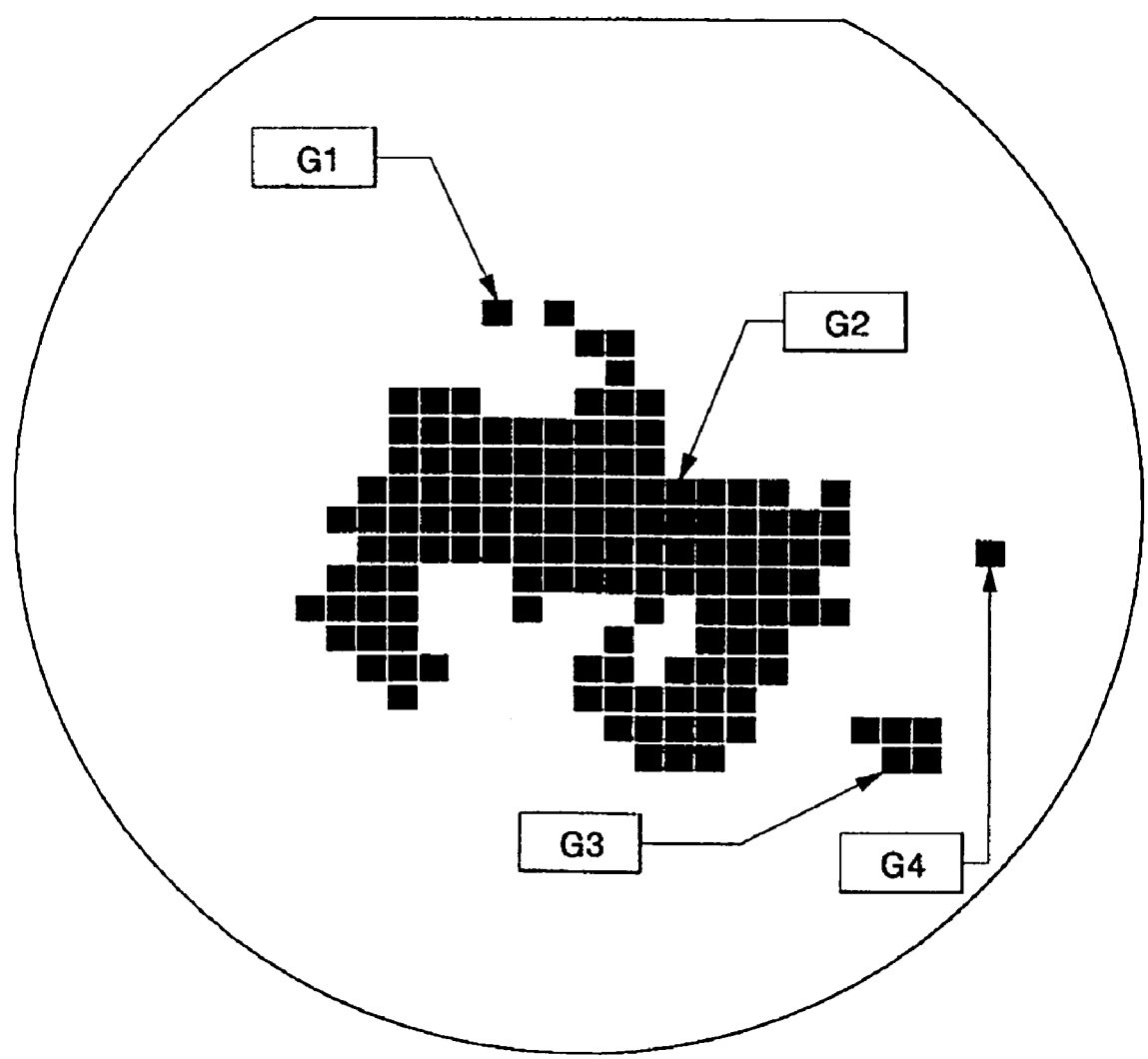
FIG. 6 illustrates an exemplary process of defining groups of filtered failed chips from a filtered wafer map.

FIG. 6 further illustrates the filtered fail chips of FIG. 5B, and identifies four (4) distinct groups of filtered failed chips. Each of these groups has a size; groups G1 and G4 contain only a single isolated chip, group G3 contains 5 chips, and group G2 contain 133 chips.

Referring now to FIG. 1B, after grouping the filtered failed chips in step (45), a defect index value (DI) is calculated for the subject wafer. Here again, any reasonable group weighting equation might be used to determine a defect index value for the subject wafer. As localized failures are deemed more informative to the quality control process than many distributed failures, the equation used to calculate the wafer defect index value (i.e., an expression ultimately used to distinguish between defective and acceptable wafers) should properly emphasize the significance of large groups of filtered failed chips on the wafer. Thus, in cases where filtered failed chips are uniformly dispersed across a wafer, the corresponding defect index value will be relatively low. However, highly localized groupings of filtered failed chips will result in a relatively high defect index value.

For example, the following equation may be used to calculate a defect index value (DI):

$$DI = \frac{\sqrt{A1^2 + A2^2 + \ldots + Ak^2}}{T},$$

where "T" is the total number of semiconductor chips on the subject wafer, "A1" is equal to the first group size (e.g., G1=1), "A2" is equal to the second group size (e.g., G2=133), . . . through "Ak" is equal to the last group size (e.g., G4=1). Application of this exemplary equation to the groupings of filtered failed chips shown in FIG. 6, a defect index value of 20.6 is obtained for the subject wafer.

Referring again to FIG. 1B, the calculated defect index value (DI) is compared to the previously selected upper critical limit value (UCL) (49). If the calculated defect index value (DI) for a subject wafer is greater than the predetermined upper critical limit value (UCL), then the subject wafer is sent to failure analysis (51). Otherwise, the testing system running the exemplary method outlined by the flowchart shown in FIGS. 1A and 1B determines whether the subject wafer is the last wafer in a lot (53), and if yes, terminates the method. Otherwise, a next wafer is selected (55) and the method returns to step (37), testing of the next wafer.

Figure 7:
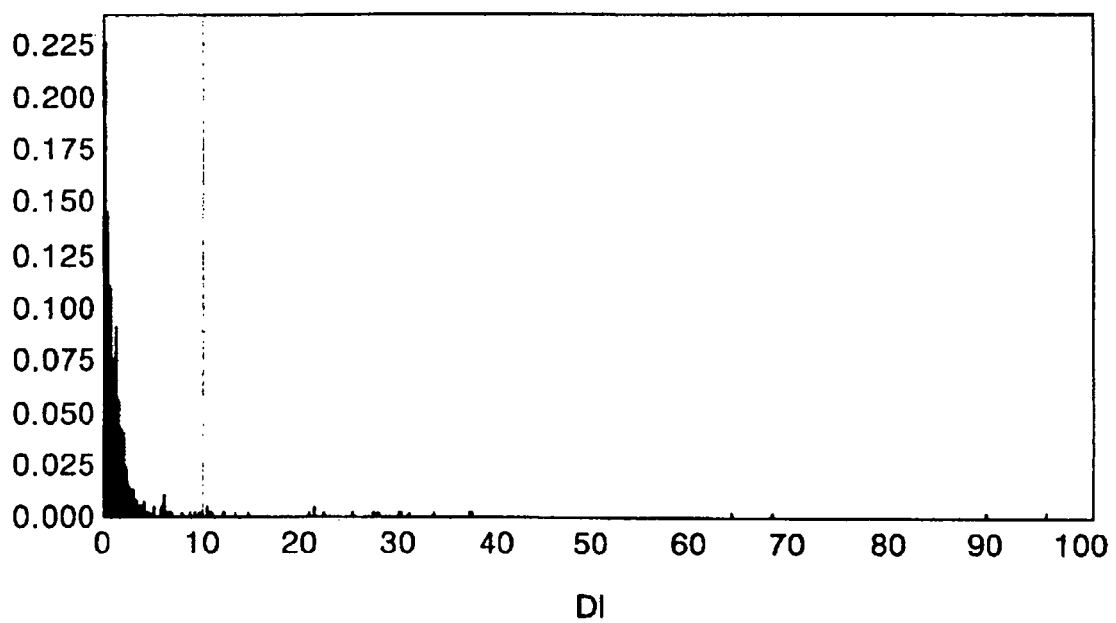
FIG. 7 is an exemplary histogram, such as the type that may be used in the definition of an upper critical limit for a defect index value useful within embodiments of the invention.
Figure 8:
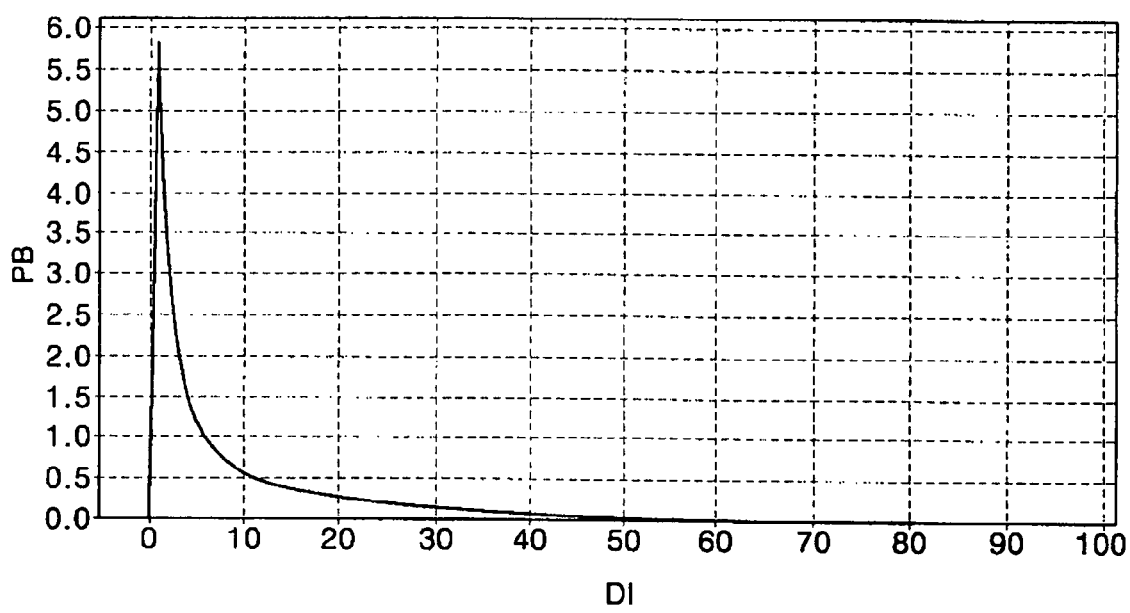
FIG. 8 is an exemplary beta probability distribution derived from the histogram data shown in FIG. 7, and like the related histogram may be used in the definition of an upper critical limit for a defect index value useful within embodiments of the invention.

Clearly, the step of predetermining a proper upper critical limit (UCL) is very important to the process of separating defective wafers having unacceptable localized failures from acceptable wafers. FIGS. 7 and 8 further illustrate one exemplary approach to the selection of an appropriate upper critical limit (UCL). The use of empirical data, which is readily available to semiconductor chip manufacturers, is central to the exemplary approach.

Empirical data may be assimilated in a histogram such as the one shown in FIG. 7. Discrete defect index values (DI) are plotted on the histogram in relation to their frequency of occurrence (F). A conventional beta probability (PB) distribution may then be calculated from the histogram data and plotted as a function of defect index value (DI). See, FIG. 8. Alpha (α) and beta (β) values may be used to construct the beta probability distribution using the following equations, where "X" is the standard mean of the histogram data and "a" is its standard deviation:

$$\beta = \frac{X \times (1-X)^2 + \sigma^2 \times (X-1)}{\sigma^2},$$

and $$\alpha = \frac{X \times \beta}{(1-X)}.$$

The resulting beta probability distribution may then be statistically evaluated in relation to fabrication conditions, production yield expectations, quality control directives, etc., to determine an appropriate upper critical limit (UCL).

Figure 9:
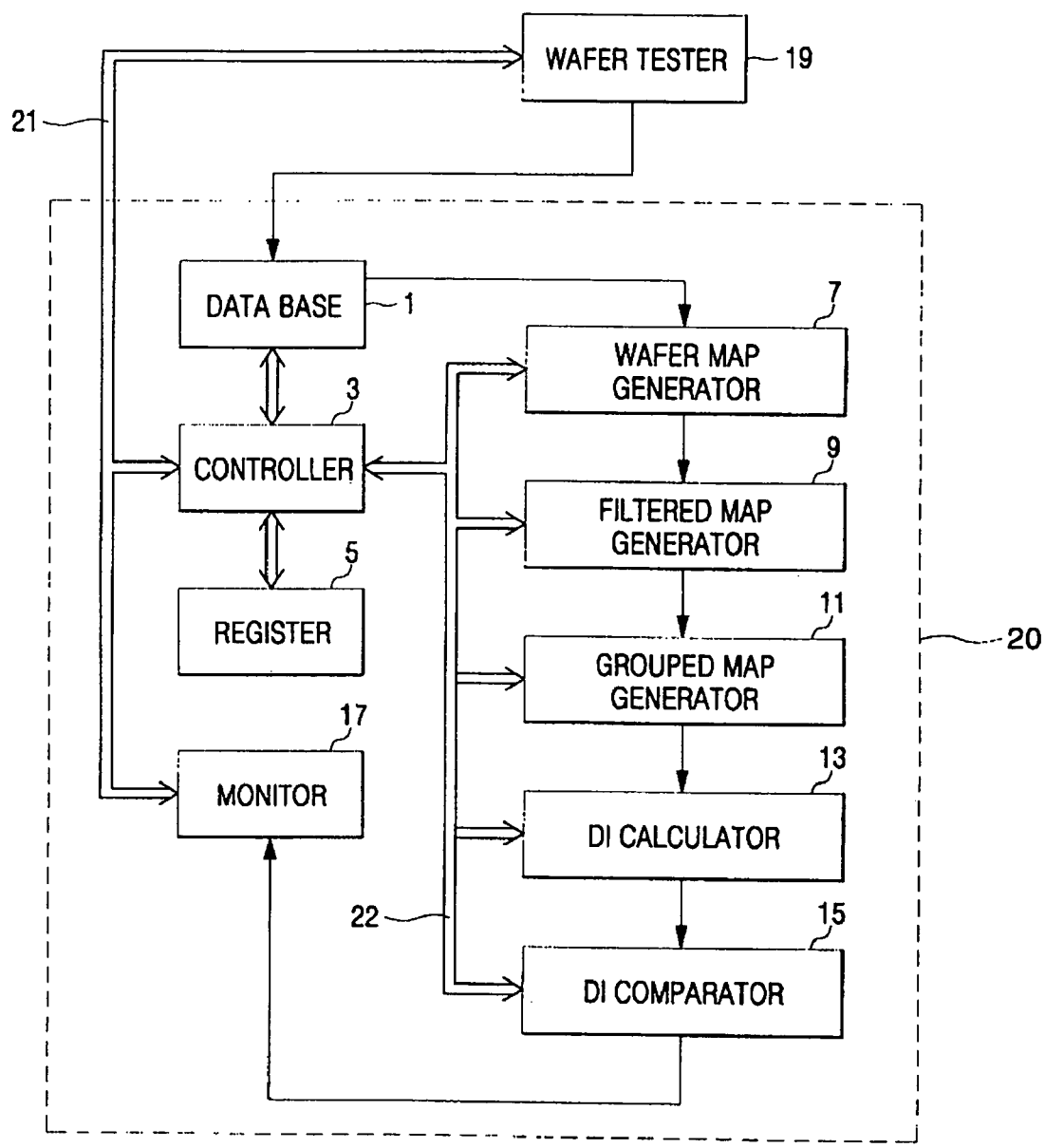
FIG. 9 is a schematic diagram illustrating selected hardware and software components within an exemplary test system adapted to execute a test method according to an embodiment of the invention.

The foregoing exemplary method of testing wafers in a wafer lot may be implemented on conventionally available testing equipment, such as one or more microprocessor controlled automated test stations, or on a custom developed test system or apparatus. FIG. 9 generally illustrates an exemplary test system adapted to implement a test method according to embodiments of the invention.

Referring to FIG. 9, test system 20 operates in conjunction with one or more wafer testers, or wafer test stations 19. As noted above, wafer tester 19 may be any device or system adapted to perform an electrical test on a subject wafer. Many different wafer testers, both generic and custom in their design, are known to those of ordinary skill in the art. A plurality of different wafer testers is often used to run a complete battery of electrical tests on a subject wafer. Thus, a generic control bus connection 21 indicates a hardwired, a wireless, or networked connection path between a test system controller 3 and wafer tester 19.

Test data derived by wafer tester 19 for each one of the semiconductor chips on the subject wafer may be stored by controller 3 in a corresponding database 1. Database 1 may take many different conventional forms, but will typically include hardware comprising some form of backed-up and/or non-violate memory. Conventional database software may be used to implement the file and access features of database 1. In addition to storing test data and data files associated with test data, database 1 may also store test equipment control programming, test system operating instructions, and/or historical test data and related data structures, etc.

Controller 3 may be a conventional microprocessor or micro-controller, such as a Pentium® microprocessor running in conjunction with a conventional set of data registers 5 and executing a convention operating system, such as Windows or Linux. Indeed, in one embodiment, test system 20 may be implemented on a conventional Personal Computer (PC). Controller 3 may also be connected to a monitor 17 (e.g., an LCD display or CRT) and/or other conventional peripheral devices such as a mouse or keyboard (not shown) within test system 20. Through such peripheral devices and/or monitor 17, a test system operator may interface with test system 20.

A wafer test method, such as the exemplary test method described above, may be implemented through the use of various computational and control functions callable in software by an operating system running on test system 20. That is, controller 3, by means of an integral operating system, for example, may call various software modules to implement the various functions implementing the test method.

Test system 20 illustrated in FIG. 9 is shown with five (5) exemplary software modules callable by controller 3 to implement a test method. These software modules include, a wafer map generator 7, a filtered map generator 9, a grouped map generator 11, a defect index value (DI) generator 13, and a DI comparator function 15. A callable relationship between controller 3 and each of these software modules is indicated in FIG. 9 by a functional connection 22. In practice, functional connection 22 will be implemented in hardware (e.g., related data/address/control signal lines connecting controller 3 with memory, such as database 1) and/or software. The exemplary modules will now be described as implementing the exemplary test method illustrated in FIGS. 1A and 1B. In so doing, the exemplary software modules should not be given an overly-literal construction relative to the scope of the invention. Those of ordinary skill in the art recognize that software is notoriously susceptible to custom implementations. Many different control and data manipulation functions and operations may be expressed (separately or in combination) in many different collections and types of software modules. Thus, the following operational description is intended to communicate functional options adapted to the efficient implementation of one or more embodiments of the invention. It does not mandate some artificial distinction between functional blocks subject to many different implementation approaches.

With reference to FIGS. 1A, 1B, and 9, upon initiating test system 20 operation, a test system operator may select a device type to be tested (31). This selection may be made using a menu presented on monitor 17. Using the same or similar graphical user interface, the test system operator may also define an appropriate spatial filter and a corresponding upper critical limit (33) using a peripheral device, such as a mouse, provided as part of the test system 20. With the test method object and criteria thus selected, a subject wafer is selected for testing (35). Controller 3 may be used to control operation of wafer tester 19 and/or an automated wafer conveyance. Wafer tester 19 then performs one or more electrical tests of the subject wafer (37) and returns test data to controller 3. This test data is used to generate a corresponding data file (39) in database 1.

With data files stored in database 1, controller 3 calls the wafer map generator 7. The term "call" or "callable" this context generally refers to any relationship whereby one piece of software invokes or initiates execution of another piece of software. When called, wafer map generator 7 generates a wafer map from the stored data file (41). The wafer map thus generated may in some embodiments be associated with a graphics file adapted to being displayed on monitor 17 to provide the test system operator with visual feedback.

Once a wafer map has been generated, controller 3 may call the filtered map generator 9. When called, filtered map generator 9 generates a filtered map (43) from one or more data files associated with the previously generated wafer map. Once a filtered wafer map has been generated, controller 3 may call the grouped map generator 11. When called, grouped map generator 11 groups clusters of filtered failed chips (45) identified in the filtered map using data from one or more data files associated with the previously generated filtered wafer map.

Once the filtered failed chips have been grouped, controller 3 may call the defect index value (DI) generator 13. When called, defect index value generator 13 calculates a defect index value (DI) for the subject wafer (47) using data derived from the grouped filtered failed chips. This calculated defect index value (DI) is then compared with an established upper critical limit (49) when controller 3 calls the DI comparator 15. Based on this comparison result, the subject wafer may be identified by operation of control 3 as a defective wafer to be sent to failure analysis (49) or an acceptable wafer. A failure analysis indication may be communicated to the test system operator via monitor 17, for example.

Following completion of the test method on the subject wafer, controller 3 may make a determination as to whether the subject wafer was the last wafer in a test lot (53), and if not, begins testing of a next wafer (55).

The foregoing exemplary operation has been described in the context of a test system operator functionally intervening at various points within the test method. However, such human operator intervention is not necessary, and in some instances may not be prudent. Thus, the foregoing exemplary test method and its exemplary test system implementation may be automated using conventional techniques to remove the human operator from all or part of the test method.

However implemented, embodiments of the invention provide remarkably improved testing results over conventional techniques. Consider the comparative example shown in FIGS. 10 and 11. Each of these Figures shows actual wafer maps for two wafers having identical semiconductor chips formed thereon. Failed semiconductor chips (FC) are indicated on each wafer map by the darkened rectangles. The first wafer shown in FIG. 10 has a 95.57% yield while the second wafer shown in FIG. 11 has a 94.79% yield.

Figure 10:
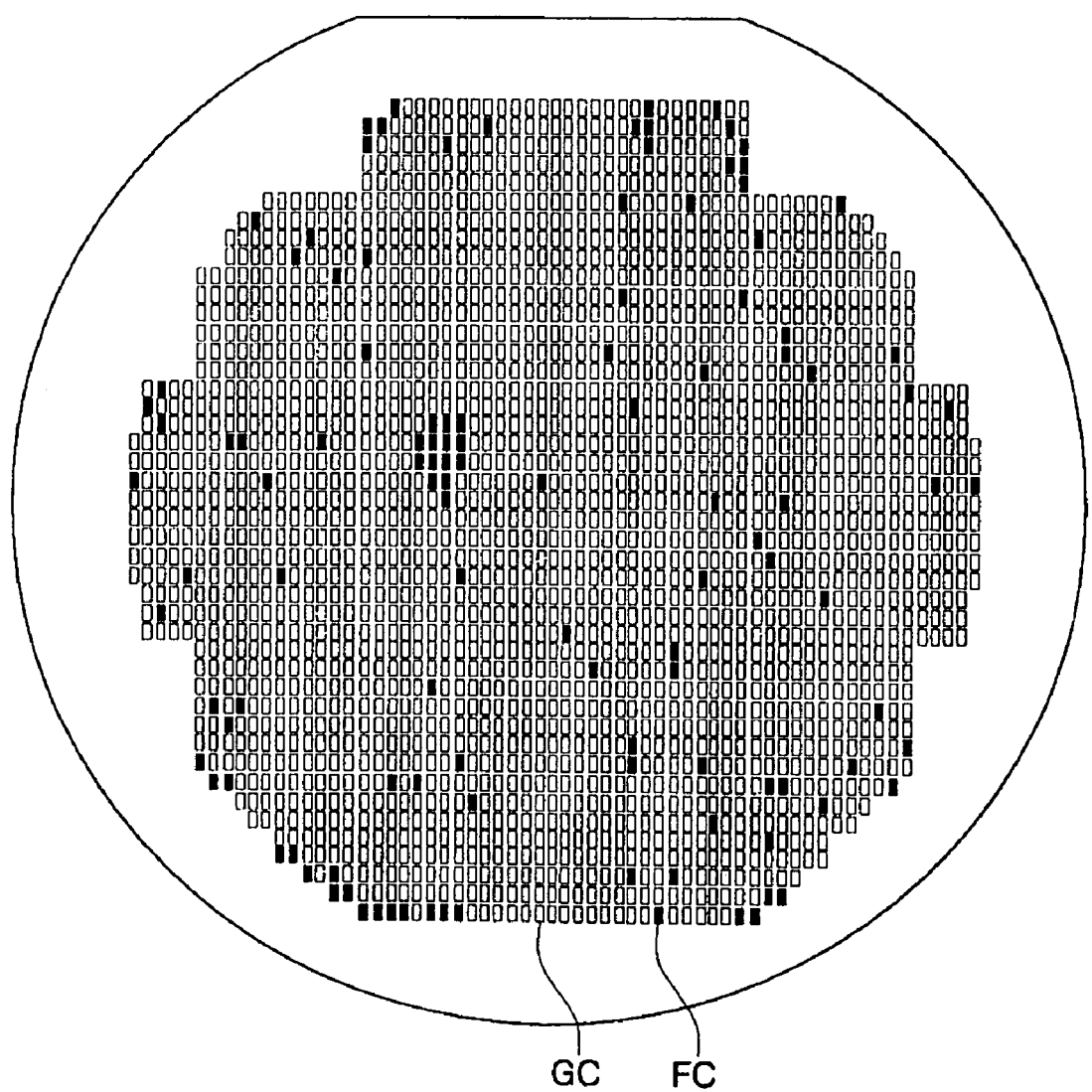
FIGS. 10 and 11 are exemplary wafer maps having different yields for similar semiconductor chips; and, FIGS. 12 and 13 are filtered wafer maps derived respectively from the wafer maps of FIGS. 10 and 11.
Figure 11:
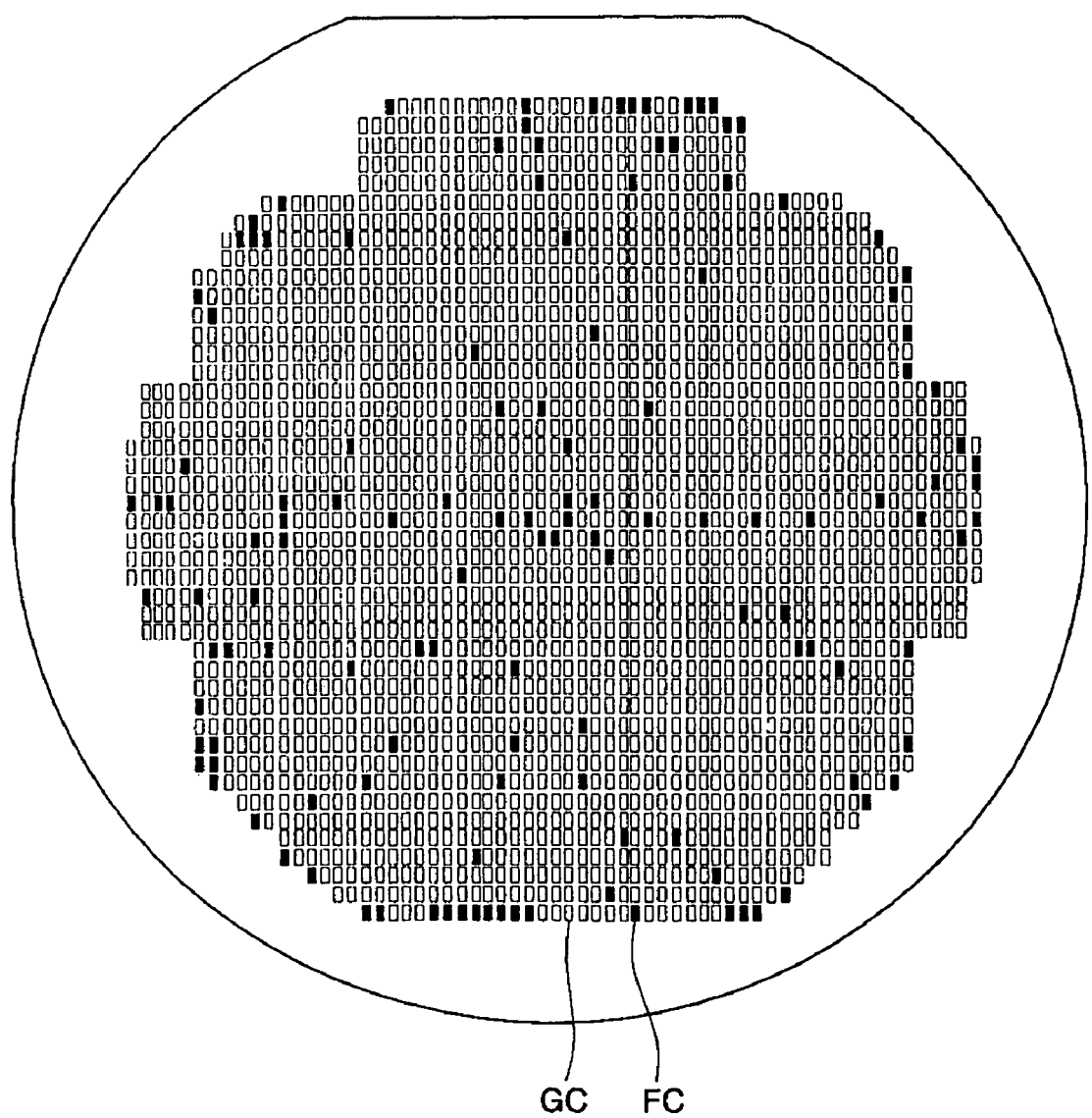
Figure 12:
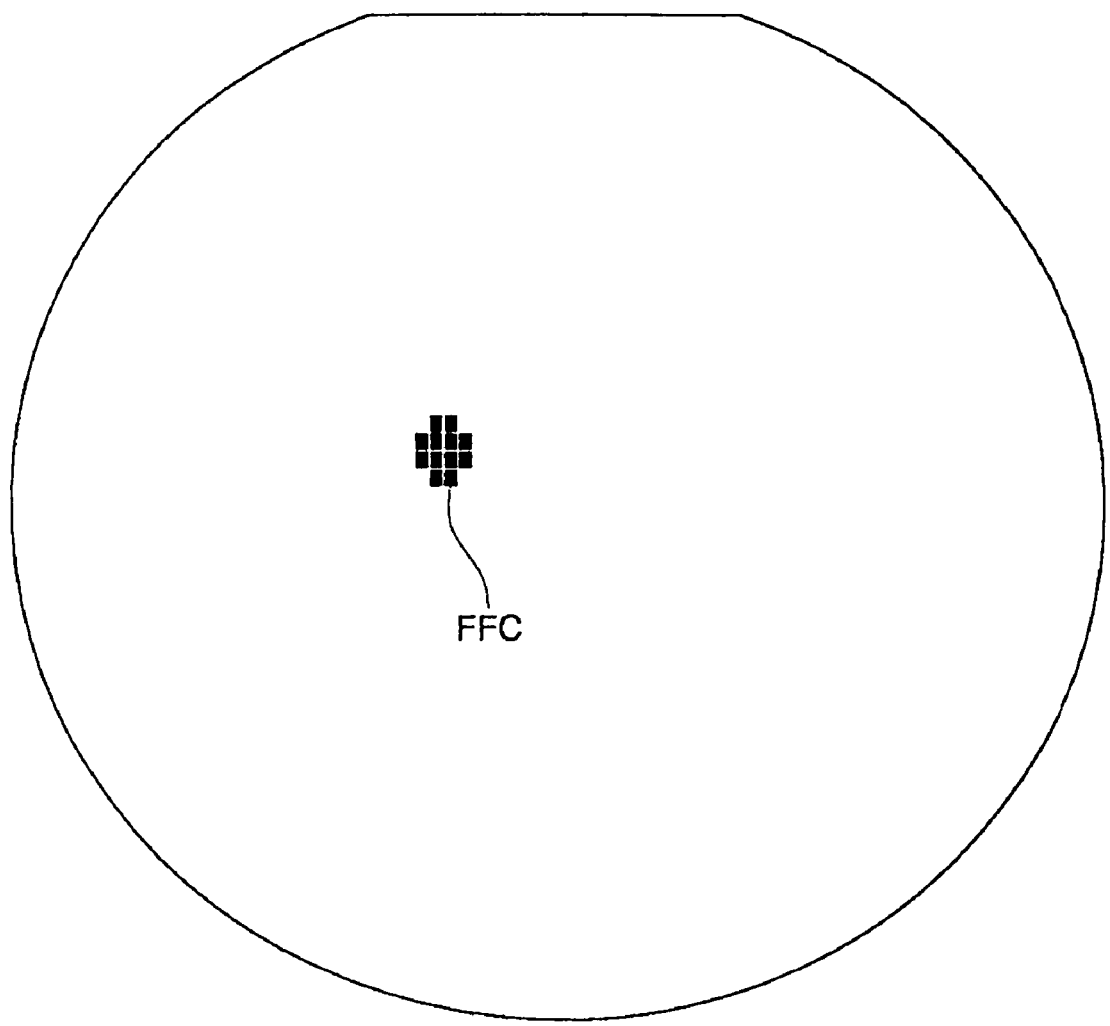
Figure 13:
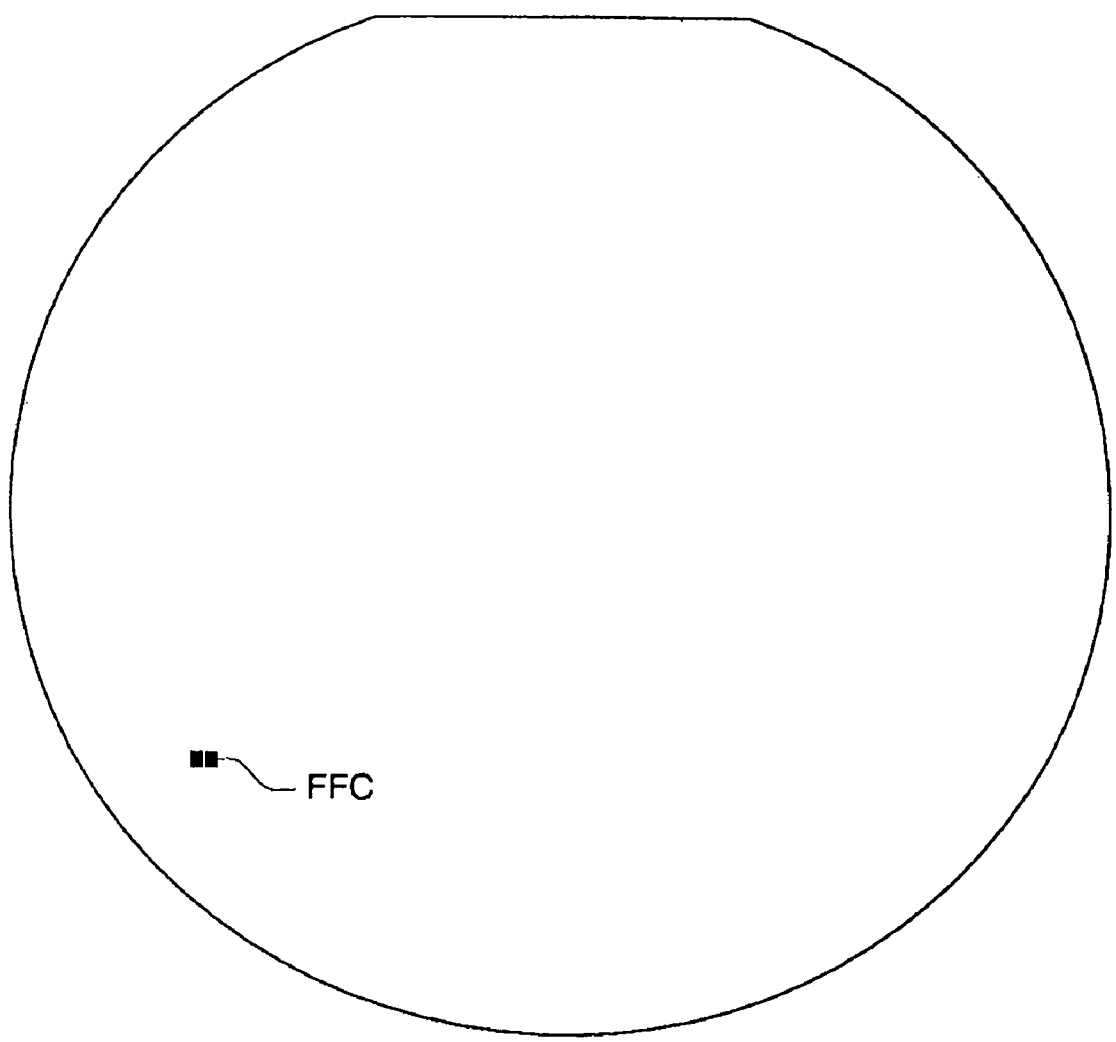

FIGS. 12 and 13 are first and second filtered wafer maps showing filtered failed chips (FFC) corresponding to the first and second wafer maps shown in FIGS. 10 and 11, respectively. A 3 by 3 spatial filter (SP) having unity weighted cells was used to generate the filtered wafer maps. An upper critical limit (UCL) of 0.5 was defined for wafer testing. Using the exemplary equations set forth above to calculate filtered values (P) and defect index values (DI), the first wafer has calculated defect index value (DI) of 0.51 and the second wafer has a calculated defect index value (DI) of 0.08. Thus, the first wafer having a 95.57% yield is deemed defective and sent to failure analysis, while the second wafer having a 94.79% yield is deemed acceptable. Further, the first filtered map shown in FIG. 12 indicates the location of a single localized failure resulting in this classification. This additional information may prove highly valuable to quality control personnel conducting the failure analysis.

The foregoing examples are presented to teach the making and use of the invention in the context of several embodiments. The actual scope of the invention in not limited to only these examples, but is defined by the following claims.

What is claimed is:

1. A method adapted to testing a wafer comprising semiconductor chips, the method comprising:
   generating a wafer map indicating first locations of failed semiconductor chips;
   generating a filtered wafer map indicating second locations of filtered failed semiconductor chips from the wafer map by applying a spatial filter of defined size to the wafer map to generate the filtered wafer map;
   calculating a defect index value from the filtered wafer map; and,
   comparing the defect index value to an upper critical limit.

2. The method of claim 1, further comprising:
   determining whether the wafer is defective on the basis of the comparison between the defect index value and upper critical limit; and,
   upon determining that the wafer is defective, conducting a failure analysis on the wafer.

3. The method of claim 1, wherein generating the wafer map comprises:
   performing an electrical test on the semiconductor chips to generate test data; and,
   on the basis of the test data, determining whether each one of the semiconductor chips is a failed semiconductor chip.

4. The method of claim 3, wherein generating the wafer map further comprises:
forming a data file from the test data; and,
forming the wafer map from the data file.

5. The method of claim 4, wherein generating the wafer map further comprises:
generating a graphics file adapted to visual display on a monitor.

6. The method of claim 1, wherein the spatial filter comprises an "n by m" matrix of cells, each having a weighting coefficient.

7. The method of claim 6, wherein the wafer map defines a layout matrix associated with an arrangement of semiconductor chips on the wafer; and,
wherein generating the filtered wafer map comprises applying the spatial filter on a one semiconductor chip by one semiconductor chip basis across the layout matrix to respective test data values associated with semiconductor chips identified in the layout matrix by application of the spatial filter.

8. The method of claim 7, wherein applying the spatial filter to one semiconductor chip comprises:
calculating a filtered value;
comparing the calculated filtered value to a reference filtered value; and,
determining whether the one semiconductor chip is a filtered failed semiconductor chip on the basis of the comparison.

9. The method of claim 8, wherein calculating the filtered value comprises:
for each proximate semiconductor chip identified by application of the spatial filter, multiplying a corresponding test data value by a corresponding weighting coefficient from the spatial filter to define a weighted product value;
summing all weighted product values; and,
dividing the summed weighted product values by the size of the spatial filter.

10. The method of claim 9, wherein each weighting coefficient has a unity value, each test data value has a single bit binary data value, and the reference filtered value is 0.5.

11. The method of claim 1 wherein generating the filtered wafer map further comprises:
generating a graphics file adapted to visual display on a monitor from the filtered wafer map.

12. The method of claim 1, wherein calculating the defect index value from the filtered wafer map comprises:
defining one or more group values related to the filtered failed semiconductor chips; and,
calculating the defect index value in relation to the one or more group values.

13. The method of claim 12, wherein calculating the defect index value in relation to the one or more group values comprises:
summing the squares of the one or more group values, taking the square root of the sum of the squares, and dividing the square root by the total number of semiconductor chips on the wafer.

14. The method of claim 1, wherein the upper critical limit is defined in relation to empirical data derived from testing semiconductor chips similar to the semiconductor chips on the wafer.

15. The method of claim 14, wherein the upper critical limit is defined in relation to a statistical model or expression of the empirical data.

16. A method adapted to determine whether a wafer is defective, comprising:
generating a wafer map indicating first locations of failed semiconductor chips on the wafer;
defining a one or more spatially related groups of filtered failed semiconductor chips on the wafer in relation to a filtered wafer map derived from the wafer map and indicating second locations of filtered failed semiconductor chips, wherein defining the one or more spatially related groups of filtered failed semiconductor chips comprises, generating the wafer map from test data indicating failed semiconductor chips on the wafer and applying a spatial filter to the wafer map to derive the filtered wafer map;
calculating a defect index value in relation to the one or more spatially related groups of filtered failed semiconductor chips; and,
comparing the defect index value to a critical upper limit.

17. The method of claim 16, wherein the method is applied sequentially to each wafer in a wafer lot; and further comprises:
generating respective graphics files from the wafer map and the filtered wafer map, each graphics file being adapted for display on a monitor substantially in real time and on a wafer by wafer basis during testing of the wafer lot.

18. The method of claim 16, further comprising:
upon determining that the wafer is defective on the basis of the comparison between the defect index value and upper critical limit, conducting a failure analysis on the wafer.

19. The method of claim 16, wherein generating the wafer map comprises:
performing an electrical test on the semiconductor chips to generate the test data;
forming a data file from the test data;
forming the wafer map from the data file; and,
on the basis of the test data, determining whether each one of the semiconductor chips is a failed semiconductor chip.

20. The method of claim 16, wherein the spatial filter comprises an "n by m" matrix of cells, each having a weighting coefficient.

21. The method of claim 20, wherein the wafer map defines a layout matrix associated with an arrangement of semiconductor chips on the wafer; and,
wherein generating the filtered wafer map comprises applying the spatial filter on a one semiconductor chip by one semiconductor chip basis across the layout matrix to respective test data values associated with semiconductor chips proximate the one semiconductor chip.

22. The method of claim 21, wherein applying the spatial filter to one semiconductor chip comprises:
calculating a filtered value;
comparing the filtered value to a reference filtered value; and,
determining whether the one semiconductor chip is a filtered failed semiconductor chip on the basis of the comparison.

23. The method of claim 22, wherein calculating the filtered value comprises:
for each proximate semiconductor chip identified by application of the spatial filter, multiplying a corresponding test data value by a corresponding weighting coefficient from the spatial filter to define a weighted product value:

summing all weighted product values; and, dividing the summed weighted product values by the size of the spatial filter.

24. The method of claim 23, wherein each weighting coefficient has a unity value, each test data value has a single bit binary data value, and the reference filtered value is 0.5.

25. The method of claim 16, wherein the upper critical limit is defined in relation to empirical data derived from testing semiconductor chips similar to the semiconductor chips on the wafer.

26. The method of claim 25, wherein the upper critical limit is defined in relation to a statistical model or expression of the empirical data.

* * * * *